United States Patent
Fritsche et al.

(10) Patent No.: US 10,938,176 B2
(45) Date of Patent: *Mar. 2, 2021

(54) DIODE LASER

(71) Applicant: HIGHYAG LASERTECHNOLOGIE GMBH, Kleinmachnow (DE)

(72) Inventors: Haro Fritsche, Berlin (DE); Ralf Koch, Lindingö (SE); Bastian Kruschke, Berlin (DE); Fabio Ferrario, Berlin (DE)

(73) Assignee: HIGHYAG LASERTECHNOLOGIE GMBH, Kleinmachnow (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/406,919

(22) Filed: May 8, 2019

(65) Prior Publication Data

US 2019/0267772 A1 Aug. 29, 2019

Related U.S. Application Data

(63) Continuation of application No. 15/512,465, filed as application No. PCT/EP2015/071197 on Sep. 16, 2015, now Pat. No. 10,320,148.

(30) Foreign Application Priority Data

Sep. 19, 2014 (EP) ..................... 14185625

(51) Int. Cl.
*H01S 5/068* (2006.01)
*H01S 3/08* (2006.01)
(Continued)

(52) U.S. Cl.
CPC .......... *H01S 5/068* (2013.01); *H01S 3/08054* (2013.01); *H01S 3/08063* (2013.01);
(Continued)

(58) Field of Classification Search
CPC .... H01S 5/068; H01S 5/4062; H01S 3/08054; H01S 3/08063; H01S 5/141;
(Continued)

(56) References Cited

U.S. PATENT DOCUMENTS 4,958,354 A 9/1990 Urakami et al.
5,400,311 A * 3/1995 Komma ............... G02B 5/1876
359/571

(Continued)

FOREIGN PATENT DOCUMENTS

DE 10 2011 006 198 A1 10/2012
EP 0 587 154 A2 3/1994
(Continued)

OTHER PUBLICATIONS

Michel et al., "Thermo-optically driven adaptive mirror for laser applications", Appl. Phys. B, pp. 721-724 (2004) (Year: 2004).*
(Continued)

*Primary Examiner* — Xinning (Tom) Niu
(74) *Attorney, Agent, or Firm* — Blank Rome LLP

(57) ABSTRACT

The present invention relates to a diode laser with external spectrally selective feedback. It is an object of the invention is to provide an external cavity diode laser with wavelength stabilization which allows an increased overall output power in the desired wavelength range. According to the invention, an external cavity diode laser arrangement is disclosed comprising: an active medium positioned inside an internal laser cavity (10), the internal laser cavity (10) comprising an exit facet (12) adapted for outcoupling laser radiation; an external frequency-selective element (14) positioned outside the internal laser cavity (10) and adapted for wavelength stabilization of the laser radiation; a beam divider (16) positioned outside the internal laser cavity (10) and adapted to divide the outcoupled laser radiation (BO) into a first (Continued)

beam (B1) extending along a first beam path (P1) and a second beam (B2) extending along a second beam path (P2), the first beam (B1) having higher radiant intensity than the second beam (B2) and the first beam path (P1) being different from the second beam path (P2); and an intensity control means to control the radiant intensity incident to the external frequency selective element (14); wherein the external frequency-selective element (14) and the intensity control means are arranged in the second beam path (P2). The intensity control means in the second beam path (P2) may comprise a polarization modifying means (18) and a polarizer (20) in order to reduce thermal stress at the frequency-selective element (14).

11 Claims, 10 Drawing Sheets

(51) Int. Cl.
| | | |
|---|---|---|
| *H01S 5/14* | (2006.01) | |
| *H01S 5/40* | (2006.01) | |
| *H01S 5/34* | (2006.01) | |
| *H01S 5/022* | (2021.01) | |
| *H01S 3/106* | (2006.01) | |
| *H01S 5/028* | (2006.01) | |
| *H01S 5/024* | (2006.01) | |
| *H01S 3/081* | (2006.01) | |
| *H01S 3/105* | (2006.01) | |

(52) U.S. Cl.
CPC ........... *H01S 5/0228* (2013.01); *H01S 5/141* (2013.01); *H01S 5/3404* (2013.01); *H01S 5/4062* (2013.01); *H01S 3/0815* (2013.01); *H01S 3/08068* (2013.01); *H01S 3/105* (2013.01); *H01S 3/106* (2013.01); *H01S 3/1068* (2013.01); *H01S 5/0287* (2013.01); *H01S 5/02438* (2013.01); *H01S 5/143* (2013.01)

(58) Field of Classification Search
CPC .... H01S 5/0228; H01S 5/02438; H01S 3/106; H01S 5/0287; H01S 3/1068; H01S 5/143
See application file for complete search history.

(56) References Cited

U.S. PATENT DOCUMENTS

| | | | |
|---|---|---|---|
| 5,793,784 | A | 8/1998 | Wagshul et al. |
| 7,397,837 | B2 | 7/2008 | Volodin et al. |
| 7,545,844 | B2 | 6/2009 | Volodin et al. |
| 8,867,586 | B2 | 10/2014 | Eppich |
| 10,320,148 | B2* | 6/2019 | Fritsche .............. H01S 3/08063 |
| 2002/0090017 | A1 | 7/2002 | Hagberg et al. |
| 2002/0105697 | A1 | 8/2002 | Fabiny |
| 2002/0191239 | A1 | 12/2002 | Psaltis et al. |
| 2005/0207466 | A1 | 9/2005 | Glebov et al. |
| 2006/0251143 | A1 | 11/2006 | Volodin et al. |
| 2008/0165821 | A1* | 7/2008 | Raab .......................... H01S 3/08 372/96 |
| 2008/0298402 | A1 | 12/2008 | Rossi et al. |
| 2010/0118389 | A1* | 5/2010 | Heinrich ................. H01S 3/235 359/342 |
| 2012/0307257 | A1* | 12/2012 | Yoshii ................. A61B 5/0066 356/479 |
| 2014/0240697 | A1 | 8/2014 | Xiang et al. |

FOREIGN PATENT DOCUMENTS

| | | | |
|---|---|---|---|
| EP | | 0587154 A2 * | 3/1994 |
| JP | | 3-93045 | 4/1991 |

OTHER PUBLICATIONS

Bouchoule, et al: "Highly Attenuating External Cavity for Picosecond-Tunable Pulse Generation from Gain/Q-Switched Laser Diodes", IEEE Journal of Quantum Electronics, vol. 29, No. 6, Jun. 1, 1993, pp. 1693-1700, XP000397606.
European Search Report corresponding to EP 14 18 5625, dated Feb. 24, 2015, 7 pages.
Fritsche, H., et al., Generating a high brightness multi-kilowatt laser by dense spectral combination of VBG stabilized single emitter laser diodes, Semiconductor Lasers and Laser Dynamics VI, 2014, 7 pages.
International Search Report and Written Opinion corresponding to PCT/EP2015/071197, dated Dec. 23, 2015, 17 pages.
Michel et al., "Thermo-optically driven adaptive mirror for laser applications", Appl. Phys. B, pp. 721-724 (2004).

* cited by examiner

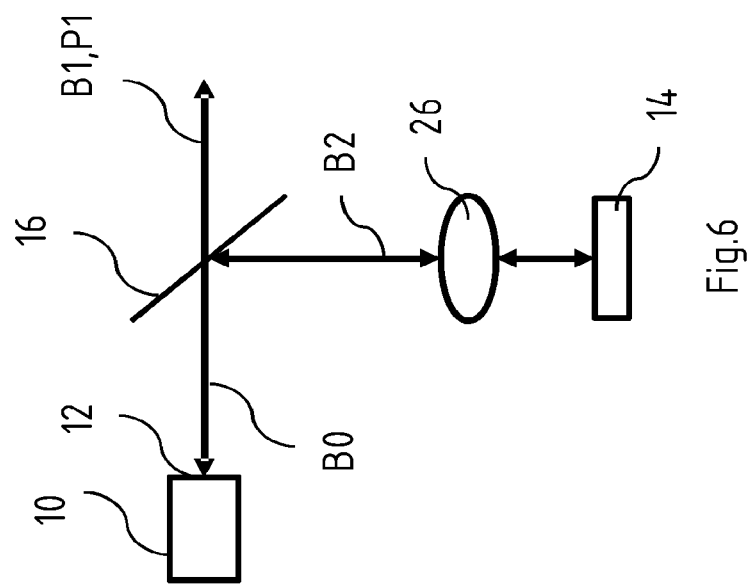

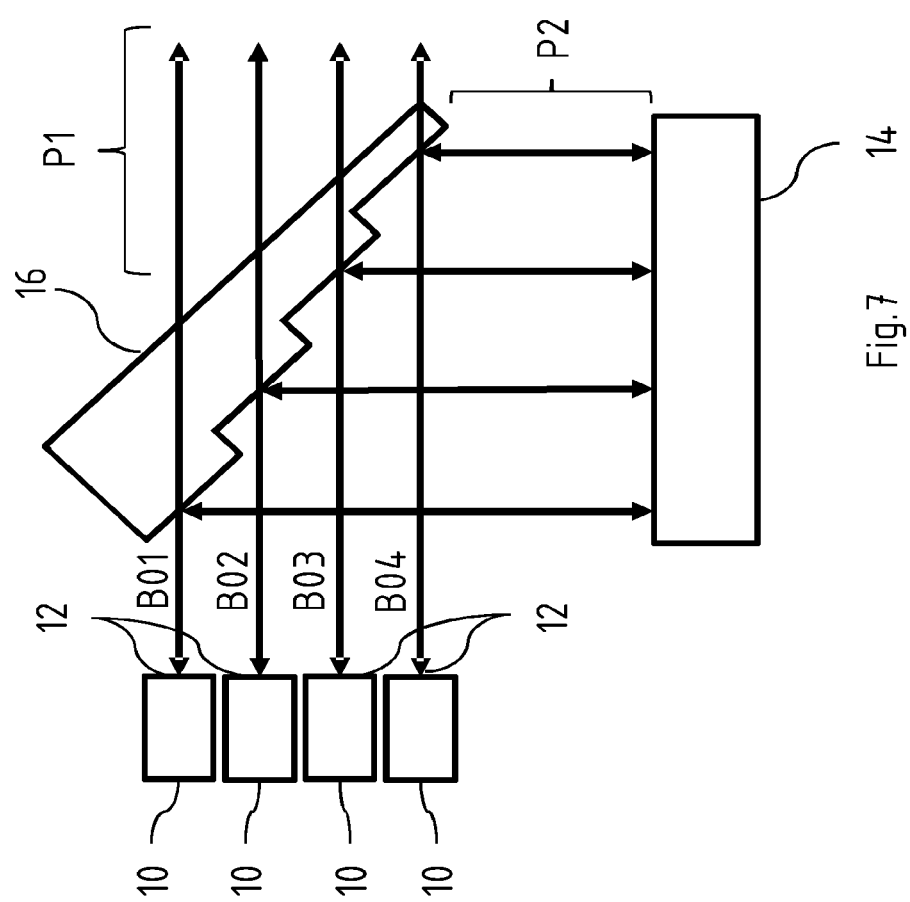

DIODE LASER

CROSS-REFERENCE TO RELATED APPLICATION(S)

This application is a continuation of U.S. patent application Ser. No. 15/512,465, filed on Mar. 17, 2017, which is a National Phase Patent Application and claims priority to and the benefit of International Application Number PCT/EP2015/071197, filed on Sep. 16, 2015, which claims priority to European Patent Application Number 14185625.2, filed on Sep. 19, 2014, the entire contents of all of which are incorporated herein by reference.

The present invention relates to a diode laser with external spectrally selective feedback.

BACKGROUND OF THE INVENTION

The radiation of edge-emitting diode lasers is highly divergent in a direction perpendicular to the waveguide plane (vertical direction, "fast axis") and has a comparatively broad wavelength spectrum. In addition, the wavelength spectrum typically depends on further parameters, such as the temperature. As a result, the wavelength spectrum depends on the power supplied by the laser.

According to the state of the art, the wavelengths can be limited and stabilized by means of internal or external wavelength-selective elements or structures. An external limitation and stabilization of the wavelength is achieved as a result of spectrally selective feedback of the emitted radiation into the diode laser. An example is a so-called external cavity diode laser (ECDL) where feedback is done by means of spectrally selective reflection e.g. on surface gratings. This, however, has the drawback that additional optical elements are required and miniaturization is made difficult.

Another way to achieve spectrally selective feedback is the use of volume Bragg gratings (also referred to as VBGs). The advantage of using such VBGs is that compact, wavelength-stabilized laser beam sources can be implemented. For example, DE 10 2011 006198 A1, US 2005/0207466 A1, US 2006/0251143 A1, U.S. Pat. No. 7,397,837 B2 and U.S. Pat. No. 7,545,844 B2 disclose how to place a volume Bragg grating in the (collimated) laser beam. However, said arrangements are disadvantageous in that the VBG is arranged within the main optical path (i.e. the path along which the laser radiation is coupled out) thereby receiving high optical energy which may result in a wavelength drift with higher radiation energies. This small shift of the peak wavelength of the locked diode lasers arises from a heating of the VBG with increasing power which causes a slight change of the locking wavelength. Furthermore, prior art laser diode systems use VBGs that provide a fixed (reflectivity) percentage for the feedback signal resulting in high intensity feedback levels for large currents of respective (current-driven) laser diodes. That is, the level of the feedback signal is higher than needed (for large diode driving currents) in order to realize wavelength stabilization thereby reducing the overall output power of the laser diode system. On the other hand, if the feedback is optimized for large diode driving current, it will be too small for low currents. Further, the VBGs in the prior art need to be adapted in their geometrical layout in order to achieve the necessary (low) reflectivity thereby causing unwanted detrimental effects such as diffraction. In addition, said laser diode arrangements suffer from reduction of the overall output power in that the used laser diode does not produce radiation being completely polarized. In fact, real laser diodes exhibit a typical degree of polarization for the main polarization direction ranging from approx. 80% to 95%. That is, the non-polarized portion of the emitted laser radiation vanishes within the laser system, e.g. at edge filters or polarizing filters.

Therefore, the object of the invention is to provide a diode laser with wavelength stabilization which overcomes the deficiencies in the prior art and which allows an increased overall output power.

SUMMARY OF THE INVENTION

According to a first aspect of the present invention a laser (preferably an external cavity diode laser) is disclosed, comprising an active medium (e.g. an active layer) positioned inside an internal laser cavity, the internal laser cavity comprising an exit facet adapted for outcoupling laser radiation; an external frequency-selective element positioned outside the internal laser cavity and adapted for wavelength stabilization of the laser radiation; a beam divider positioned outside the internal laser cavity and adapted to divide the outcoupled laser radiation into a first beam extending along a first beam path and a second beam extending along a second beam path, the first beam having higher radiant intensity than the second beam and the first beam path being different from the second beam path; and an intensity control means to control the radiant intensity incident to the frequency selective element; wherein the external frequency-selective element and the intensity control means are arranged in the second beam path.

The main idea of the invention is to arrange the external frequency-selective element outside the main beam path comprising at least the majority, i.e. more than 50% of the outcoupled laser radiation power. Accordingly, the external frequency-selective element can be positioned in an additional feedback (i.e. in the second) beam path being different from the main (i.e. in the first) beam path, wherein the radiant intensity incident to the frequency selective element is controlled by a suitable intensity control means thus that the additional feedback beam path having lower radiant intensity thereby resulting in less thermal stress for the frequency-selective element.

Preferably, the active medium is comprised by a laser diode which is formed as an edge-emitting laser diode. Preferably, the internal laser cavity is formed by at least two opposing mirrors. Alternatively, the active medium can be comprised by a solid-state laser with broad gain bandwidth such as Yb-doped materials or line selection in solid-state laser materials with several discrete lines close to each other. Preferably, the active medium is adapted to emit radiation with a wavelength having its maximum intensity within the range of 400 nm to 2900 nm, more preferably 750 nm to 1100 nm, more preferably 1400 nm to 1600 nm or 1700 to 2000 nm. Preferably, the active medium comprises a semiconducting material. More preferably, the active medium consists of a semiconducting material.

Preferably, the intensity incident to the frequency selective element is controlled by the intensity control means such that it is increased or decreased when the overall intensity of an ECDL according to the present invention is decreased or increased, respectively. More preferably, the intensity in the feedback beam path is held constant or nearly constant by means of the intensity control means. Even more preferably, the intensity in the feedback beam path is controlled such that a constant intensity is feed back into the internal laser cavity or, more specifically, into the active medium inside the internal laser cavity.

Preferably, the intensity control means can be an individual element arranged in the second beam path. More preferably, the intensity control means is being comprised by the beam divider and/or the frequency selective element arranged in the second beam path in an integrated fashion. Even more preferably, the intensity control means is comprised by a combination of individual and integrated elements, all elements arranged in the second beam path. The intensity control means can either be formed as a passive intensity control means or as an active intensity control means.

Preferably, the radiant intensity of the first beam is greater than 60% of the radiant intensity of the outcoupled laser radiation while the radiant intensity of the second beam is smaller than 40% of the radiant intensity of the outcoupled laser radiation, more preferably, the radiant intensity of the first beam is greater than 70% of the radiant intensity of the outcoupled laser radiation while the radiant intensity of the second beam is smaller than 30% of the radiant intensity of the outcoupled laser radiation, more preferably, the radiant intensity of the first beam is greater than 80% of the radiant intensity of the outcoupled laser radiation while the radiant intensity of the second beam is smaller than 20% of the radiant intensity of the outcoupled laser radiation, and still more preferably, the radiant intensity of the first beam is greater than 90% of the radiant intensity of the outcoupled laser radiation while the radiant intensity of the second beam is smaller than 10% of the radiant intensity of the outcoupled laser radiation.

Preferably, the external frequency-selective element is formed as a reflector. More preferably, the reflector is formed as a Volume Bragg Grating which is also referred to as VBG. Preferably, a (maximum) reflectance of the reflector at a specific wavelength—for which the external frequency-selective element is designed—is greater than 60%, more preferably greater than 70%, more preferably greater than 80%, more preferably greater than 90%, more preferably greater than 95% and still more preferably greater than 99% for said specific wavelength. Preferably, the reflectance of the reflector at a second wavelength differing from said specific wavelength (at which the reflectance is maximum) by more than 5 nm (more preferably by more than 4 nm, more preferably by more than 3 nm, more preferably by more than 2 nm and still more preferably by more than 1 nm) is less than 60%, more preferably less than 40%, more preferably less than 20%, more preferably less than 10% and still more preferably less than 5% of the maximum reflectance. In other words, the reflector exhibits a high maximum reflectance over a small wavelength range thereby generating a wavelength-specific feedback signal which is coupled back into the internal laser cavity thereby stabilising the laser emission wavelength. The reflection bandwidth of the reflector for which a reflectance is 50% of the maximum reflectance or higher is preferably less than 2 nm, more preferably less than 1 nm, more preferably less than 0.5 nm and still more preferably less than 0.2 nm.

Preferably, a distance between the exit facet of the internal laser cavity and the beam divider is relatively small in order to obtain a compact design. In other words, a distance between the exit facet of the internal laser cavity and the beam divider is preferably less than 100 cm, more preferably less than 50 cm, more preferably less than 25 cm, more preferably less than 10 cm and still more preferably less than 5 cm. Preferably, a distance between the beam divider and the external frequency-selective element is relatively small in order to obtain a compact design as well. In other words, a distance between the beam divider and the external frequency-selective element is preferably less than 100 cm, more preferably less than 50 cm, more preferably less than 25 cm, more preferably less than 10 cm and still more preferably less than 5 cm.

Preferably, the exit facet (also referred to as front facet) comprises a reflectivity for the emitted laser radiation ranging from 0.1% to 12%, more preferably from 0.1% to 6% and still preferably from 0.1% to 3%. Preferably, the back facet comprises a reflectivity for the emitted laser radiation ranging from 80% to 99.999%, more preferably from 95% to 99.99% and still preferably from 99.0% to 99.99%.

Preferably, the beam divider is one selected from a polarizing beam divider, a thin film polarizer and a Glan Laser Polarizer (aka "Glan-Taylor Polarizer"). That is, the laser diode according to an aspect of the present invention intends to increase the overall output power by employing such portions of non-polarized emitted light of the laser diode for realising frequency stabilisation. In conventional laser diode systems, the non-polarized portion of the emitted laser radiation vanishes in the laser system, e.g. at edge filters or polarizing filters, however, according to the present invention, the non-polarized portion of the emitted laser radiation is outcoupled into the second beam path for being (frequency-selectively) reflected back into the internal laser cavity for frequency (or wavelength) stabilisation. For obtaining a sufficient feedback signal for frequency stabilisation it is preferable to utilize a laser diode which does not generate completely polarized radiation. Preferably, the laser diode is formed such that a degree of polarization (for the main polarization direction) ranges from 60% to 99%, more preferably from 70% to 97%, more preferably from 80% to 95% and still more preferably from 85% to 92%.

Preferably, a polarization modifying means is arranged in the second beam path between the beam divider and the external frequency-selective element, wherein a polarizer is located in the second beam path between the polarization modifying means and the external frequency-selective element. The advantage of this preferred embodiment is that an intensity of the wavelength-specific feedback signal (which is coupled back into the internal laser cavity) can be controlled. That is, the overall intensity of the laser diode can be controlled by the pumping energy, e.g. by controlling driving current of the laser diode. The radiation intensity in the second beam path (and accordingly the intensity of the feedback signal) correlates with the radiation intensity outcoupled from the laser diode. Therefore, the intensity of the feedback signal increases when the overall laser diode emission intensity increases which can imply thermal stress for the external frequency-selective element which is e.g. formed as a VGB. However, an intensity of the feedback signal only needs to be above a certain (absolute) threshold value. Accordingly it is advantageous to adapt the polarization modifying means such that an intensity of the radiation at the VBG is independent from the overall intensity of the laser diode, more specifically to control the polarization in the second beam path such that an intensity of the radiation passing through the polarizer ranges between 100% and 200%, more preferably between 100% and 150% and still more preferably between 100% and 120% of a (minimum) threshold value which is necessary to obtain stable lasing operation of the laser diode. The polarization modifying means is preferably formed as an electro-optical polariser. More preferably, the polarization modifying means is formed as a Pockels cell. The polarizer being located in the second beam path between the polarization modifying means and the frequency-selective element is preferably formed as a thin film polarizer being arranged at the Brewster angle with respect to a main beam propagation direction in the second beam path.

Preferably, the polarization modifying means is connected to (a control unit of) the (current driven) laser diode. Preferably, the polarization modifying means is connected to a means for detecting (or determining) the overall radiation intensity of the laser diode or an equivalent thereof.

According to an alternative preferred embodiment, the polarization modifying means is arranged in the first beam path between the beam divider and the exit facet of the internal laser cavity, wherein the polarizer is located in the second beam path between the beam divider and the external frequency-selective element. According to this preferred embodiment it is also possible to obtain a controlled feedback signal for laser diodes which (substantially) emit completely polarized radiation.

According to an alternative preferred embodiment, the external frequency-selective element comprises a mirror with intensity dependent reflection coefficient in order to adapt the intensity of the feedback signal to be independent from the overall intensity of the laser diode. Such mirror with intensity dependent reflection coefficient are known in the art, e.g. from Michel et al., "Thermo-optically driven adaptive mirror for laser applications", Appl. Phys. B, pp. 721-724 (2004). Preferably the mirror with intensity dependent reflection coefficient is adapted such that the intensity of the feedback signal varies by less than 30%, more preferably by less than 20%, more preferably by less than 10% and still more preferably by less than 5% irrespective of the overall intensity of the laser diode.

Preferably, the mirror with intensity dependent reflection coefficient is connected to (a control unit of) the (current driven) laser diode. Preferably, the mirror with intensity dependent reflection coefficient is connected to a means for detecting the overall radiation intensity of the laser diode or an equivalent thereof.

According to an alternative preferred embodiment, the beam divider is a non-polarizing beam divider. According to this preferred embodiment it is also possible to obtain a controlled feedback signal for laser diodes which emit completely polarized radiation.

Preferably, the (non-polarizing) beam divider comprises a plurality of portions with different partial reflectivity, the plurality of portions being arranged side by side (but not necessarily directly adjoining) to each other. Preferably, the laser diode arrangement further comprises means for (preferably transversally) moving the beam divider (preferably with respect to the propagation direction of the outcoupled laser radiation). Preferably, the laser diode arrangement further comprises means for controlling the (transversal) movement of the beam divider. Preferably, the means for controlling the (transversal) movement of the beam divider are adapted to control the movement of the beam divider in dependence of the intensity of the outcoupled laser radiation. Preferably, means for controlling the transversal movement of the beam divider are adapted to control the movement of the beam divider such that an intensity of the feedback signal varies by less than 30%, more preferably by less than 20%, more preferably by less than 10% and still more preferably by less than 5% irrespective of the overall intensity of the laser diode. Preferably, the plurality of portions with different partial reflectivity is directly adjoining to each other or an equivalent thereof.

Preferably, the means for controlling the transversal movement of the beam divider is connected to (a control unit of) the (current driven) laser diode. Preferably, the means for controlling the movement of the beam divider is connected to a means for detecting the overall radiation intensity of the laser diode or an equivalent thereof.

According to a preferred embodiment (instead of using means for moving the beam divider as well as means for controlling the movement of the beam divider) the laser diode arrangement further comprises a multi portion mirror comprising a plurality of portions with different reflectivity, the plurality of portions being arranged side by side (but not necessarily directly adjoining, e.g. on a circle) to each other, the multi portion mirror being arranged in the second beam path between the (preferably non-polarizing) beam divider and the external frequency-selective element, wherein a deflection means is arranged in the second beam path between the beam divider and the multi portion mirror, wherein the deflection means is adapted to deflect the radiation in the second beam path onto different portions of the multi portion mirror in dependence of the intensity of the outcoupled laser radiation. Preferably, the plurality of portions with different reflectivity is directly adjoining to each other.

According to an aspect of the present invention, the laser diode arrangement comprises a plurality of diode lasers having internal laser cavities, each internal laser cavity comprising an exit facet adapted for outcoupling laser radiation, wherein the internal laser cavities are arranged such that a plurality of stacked laser beams is directed onto a common beam divider. Preferably, the plurality of stacked laser beams is arranged such to be parallel to each other.

Preferably, the common beam divider comprises a plurality of stepped portions, each of the stepped portions being adapted to divide one among the plurality of stacked parallel laser beams into a respective first beam extending along a first beam path and a respective second beam extending along a second beam path, the respective first beam having higher radiant intensity than the respective second beam and the respective first beam path being different from the respective second beam path.

Preferably, all stepped portions have the same inclination with respect to the propagation direction of the plurality of stacked laser beams. Preferably, the stepped portions are arranged to be located equidistantly from each other.

According to a preferred embodiment, the laser diode arrangement further comprises a deflection means being arranged in the second beam path between the beam divider and the external frequency-selective element, wherein the deflection means is adapted to deflect the radiation in the second beam path such that only a portion of the radiation in the second beam path is guided onto an active area of the external frequency-selective element, the amount of the radiation portion depending of the intensity of the outcoupled laser radiation. Preferably, no further element is arranged in the second beam path between the deflection means and the external frequency-selective element. Preferably, the deflection means is formed as an acousto-optic modulator (AOM) or as a spatial light modulator (SLM).

According to a preferred embodiment, the laser diode arrangement further comprises an intensity-adaptive focussing lens being arranged in the second beam path between the beam divider and the external frequency-selective element, wherein focussing lens is adapted to focus the radiation in the second beam path onto an active area of the external frequency-selective element, the focusing power of the focussing lens depending of the intensity of the outcoupled laser radiation. Such intensity-dependent focussing lenses are known in the art, e.g. from R. Koch, "Selfadaptive optical elements for compensation of thermal lensing effects in diode end-pumped solid state lasers—proposal and preliminary experiments", Optics Communications 140 (1997), 158-164. Preferably, no further element is arranged in the second beam path between the focussing lens and the external frequency-selective element.

According to another aspect of the present invention a laser (preferably a diode laser) is disclosed, comprising an active medium (e.g. an active layer) positioned inside a laser cavity, the laser cavity comprising an exit facet adapted for outcoupling laser radiation; an external frequency-selective element positioned outside the laser cavity and adapted for wavelength stabilization of the laser radiation, and a beam divider adapted to divide the outcoupled laser radiation into a first beam extending along a first beam path and a second beam extending along a second beam path, the first beam having higher radiant intensity than the second beam and the first beam path being different from the second beam path, wherein the external frequency-selective element is arranged in the second beam path.

The main idea of that aspect of the invention is to arrange the external frequency-selective element outside the main beam path comprising at least the majority, i.e. more than 50% of the outcoupled laser radiation power. Accordingly, the external frequency-selective element can be positioned in an additional feedback (i.e. in the second) beam path being different from the main (i.e. in the first) beam path, the additional feedback beam path having lower radiant intensity thereby resulting in less thermal stress for the frequency-selective element.

BRIEF DESCRIPTION OF THE DRAWINGS

In the following the invention will be described in further detail. The examples given are adapted to describe the invention, but not to limit the invention in any case. Specifically, the invention is not limited to diode lasers comprising an active medium and an internal laser cavity. The active medium and/or the internal laser cavity may be comprised by any suitable laser system.

FIG. 6 shows a schematic sectional view of a laser diode arrangement according to a sixth preferred embodiment of the present invention, and FIG. 7 shows a schematic sectional view of a laser diode arrangement according to a seventh preferred embodiment of the present invention.

DETAILED DESCRIPTION OF THE DRAWINGS

Figure 1:
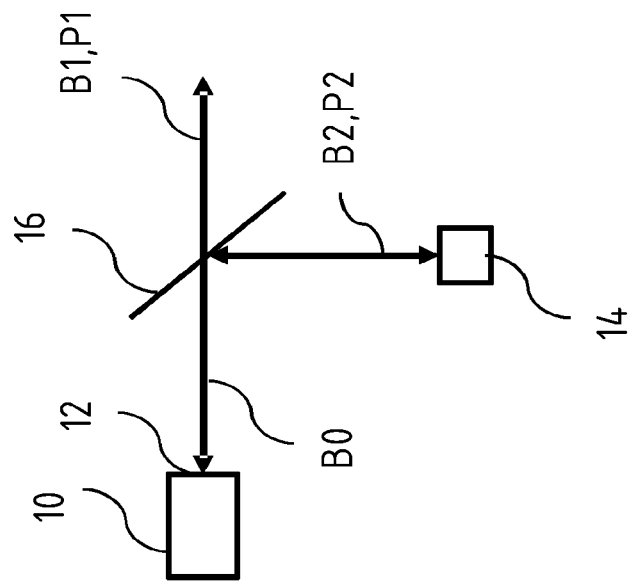
FIG. 1 shows a schematic sectional view of a laser diode arrangement according to a first preferred embodiment of the present invention.

FIG. 1 shows a schematic sectional view of a laser diode arrangement according to a first preferred embodiment of the present invention.

Diode lasers are used for pumping solid state lasers and serve the applications of plastic welding, brazing, cladding and heat conduction welding, to name the major markets. Keyhole welding and more importantly cutting is not cost effectively possible with conventional diode laser systems due to their limited power and beam quality. Keyhole welding requires a beam quality in the range of 10 to 20 mm*mrad with powers in the range from 1 kW up to 6 kW and more. Cutting requires a beam quality of less than 10 mm*mrad and power levels in the range of 2 kW to 4 kW, specifically about 3 mm*mrad and 2 to 3 kW for thin gauge cutting up to several millimeters, and about 7 mm*mrad for thicker gauge materials.

Optical stacking is known for power scaling, and many different configurations are available for bars and single emitters. Spectral stacking allows scaling of brightness and power. A narrow and stable spectrum of individual diodes is required for subsequent spectral combining of multiple diodes with different wavelengths. Multiple single emitters, each e.g. rated at 12 W, can be stacked e.g. in the fast axis with a monolithic slow axis collimator (SAC) array. Even though most preferred embodiments of the present invention relate to a single emitter diodes it should be understood that optical stacking and/or spectral stacking can be advantageously deployed throughout all embodiments of the present invention.

The power and brightness of these systems enables the use of diode lasers for cutting and welding. The technologies can be transferred to other wavelengths to include 793 nm and 1980 nm. Optimized spectral combining enables further improvements in spectral brightness and power. Fast control electronics and miniaturized switched power supplies enable pulse rise times of less than 10 µs, with pulse widths continuously adjustable from 20 µs to cw.

In a preferred embodiment, externally arranged Volume Bragg Gratings stabilize the wavelength and narrow the line width to less than 1 nm. Wavelength stabilization with external frequency-selective elements such as VBGs reflects part of the emitted light with the desired wavelength back into the diode. The design of the external resonator, i.e. the diode front facet reflectivity (i.e. the outcoupling facet reflectivity) as well as the reflectivity and dimensions of the external frequency-selective element determine the resulting line width and locking range. Typically, the line width is narrowed from 5 nm (FWHM) to a 0.3 nm (FWHM) spectra, equivalent to 95% of the power within less than 1 nm. With a proper resonator design, the peak wavelength is almost constant varying the drive current from threshold (e.g. 0.5 A) to full power (e.g. 12 A). The resonator design determines the locking range and higher locking ranges are achieved with higher reflectivity, but power losses increase.

According to the first preferred embodiment of the present invention as shown in FIG. 1, a laser diode, which comprises an active layer and an internal laser cavity 10, comprises an exit facet 12 through which the laser radiation B0 of the laser diode is coupled out.

The laser diode is typically based on a double hetero structure for the 9xx nm region built up in a sandwich manner consisting of gallium arsenide (GaAs) with aluminium arsenide ($Al_xGa_{(1-x)}As$). In the broad strip diode laser of the present embodiment with an output power of 12 W at 10 A drive current and an emitting wavelength of 970 nm, the emitting surface has an area of about 96×4 µm with an facet coating of 3%. The small height of the emitting area and the high difference between the refractive index of the laser material and air results in a high divergence of up to 23°, the so called fast axis. The divergence in the slow axis is only 4°.

The degree of polarisation is determined by the gain within the waveguide, which is different for pi (TE) and sigma (TM) polarized light and somewhat greater for sigma polarized light. The degree of polarisation depends on the tension of the embedded quantum wells. By compressive or tensile strains in the quantum well structure the polarisation can be switched from TE to TM. This change in the tension influences the heavy and light hole gain differently. But this has also an influence on the performance of the laser diode which means that there is a fixed polarisation at best performance.

The laser diode exhibits a degree of polarization of approx. 93% for the main polarization direction which is parallel polarization in the present embodiment. The outcoupled laser radiation B0 is directed to a polarizing beam splitter 16 which transmits all radiation with parallel polarization into the first beam path P1 thereby forming a first beam B1. The intensity of the first beam B1 is approx. 95% of the intensity of the outcoupled laser beam B0. Further, the polarizing beam splitter 16 deflects the portion of the radiation B0 which is different to parallel polarization into the second beam path P2 thereby forming a second beam B2. The advantage of the first embodiment of the present invention is that a portion of the radiation B0 which is different to main polarization direction (parallel) can be used for wavelength stabilization in the second beam path which only has an intensity of approx. 5% of the intensity of the outcoupled laser beam B0 thereby minimising thermal stress for the frequency-selective element 14 which is formed as a VBG. The VBG 14 only reflects a narrow portion of 0.3 nm (FWHM) of the beam B2 back into the laser diode thereby stabilising the wavelength of the outcoupled laser beam B0.

Figure 2:
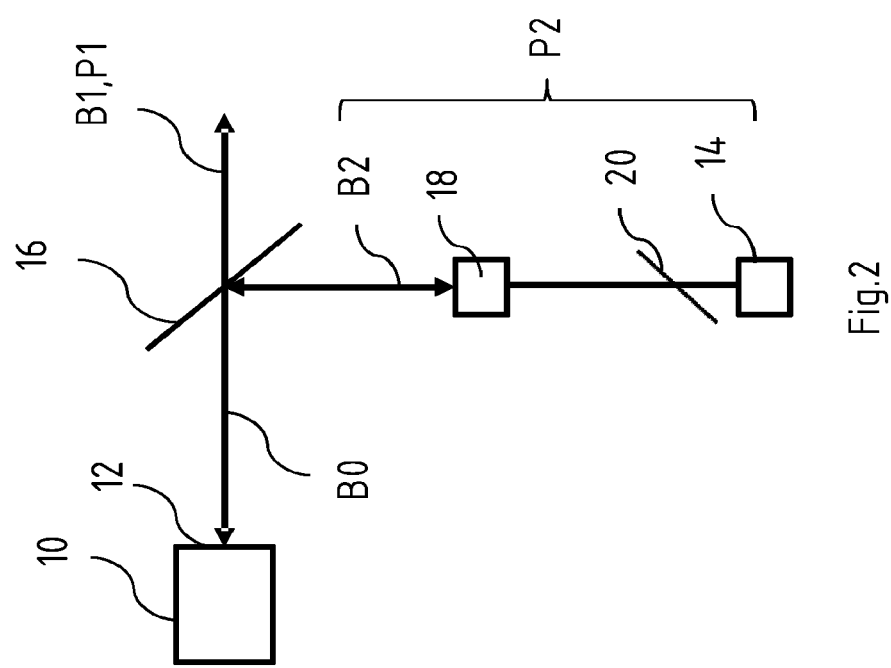
FIG. 2 shows a schematic sectional view of a laser diode arrangement according to a second preferred embodiment of the present invention.

FIG. 2 shows a schematic sectional view of a laser diode arrangement according to a second preferred embodiment of the present invention. The embodiment of FIG. 2 is similar to that of FIG. 1 but further includes a polarization modifying means 18 and a polarizer 20 located in the second path P2. A further advantage of this embodiment is that an intensity of the second beam B2 (prior to reaching the VBG 14) can be adjusted such that the intensity of the second beam B2 is lower than a predetermined value being set such that the intensity of the second beam B2 which is reflected back into the laser diode is sufficient for enabling stable laser operation at the desired wavelength for which the VBG 14 is designed. At the same time, the predetermined value is set such that the intensity of the second beam B2 which is directed onto the VBG 14 is sufficiently low for avoiding thermal stress at the VBG 14.

Figure 3:
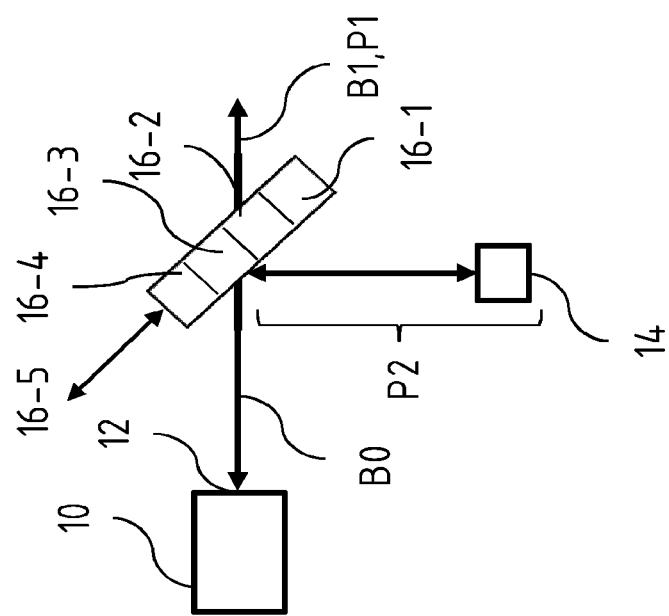
FIG. 3 shows a schematic sectional view of a laser diode arrangement according to a third preferred embodiment of the present invention.

FIG. 3 shows a schematic sectional view of a laser diode arrangement according to a third preferred embodiment of the present invention. The embodiment of FIG. 3 is similar to that of FIG. 1 but comprises a beam divider 16 having four different portions 16-1, 16-2, 16-3 and 16-4, each of the portions 16-1, 16-2, 16-3 and 16-4 having a different reflectance for the outcoupled laser radiation B0. Preferably, the beam divider 16 is a non-polarizing beam divider. The laser diode arrangement according to the third preferred embodiment further comprises means 16-5 for moving the beam divider 16 along its longitudinal axis depicted by the arrows. The advantage of this embodiment is that the intensity of the second beam B2 which is reflected back into the laser diode can be controlled by moving the beam divider 16 such that only one of the portions 16-1, 16-2, 16-3 and 16-4 is selected to split the beam B0 into the first and second beams B1, B2 such that an intensity of the second beam B2 is sufficiently high for enabling stable laser operation and sufficiently low for avoiding thermal stress at the VBG 14. In order to adapt the intensity of the second beam B2 such to be independent from the intensity of outcoupled laser beam B0, the means 16-5 for moving the beam divider 16 is preferably connected to a means for detecting the intensity of outcoupled laser beam B0.

FIGS. 4a to 4d show a schematic sectional view of a laser diode arrangement according to a fourth preferred embodiment of the present invention. The embodiments of FIG. 4a to FIG. 4d are similar to that of FIG. 1 but each embodiment has a non-polarizing beam divider 16 instead of a polarizing beam divider and further includes deflection means 24 and a mirror 22, 28 that can either be a multi portion mirror 22 or a curved mirror 28. The advantage of this embodiment is that deflection means 24 and the (multi portion) mirror 22, 28 are fixed in this embodiment while the beam divider 16 of the third embodiment (which is also a partial multi portion mirror) was arranged to be movable along its longitudinal axis. The deflection means 24 is e.g. formed as an AOM. The AOM 24 can be controlled to deflect the beam B2 in dependence of the intensity of the second beam B2.

Figure 4A:
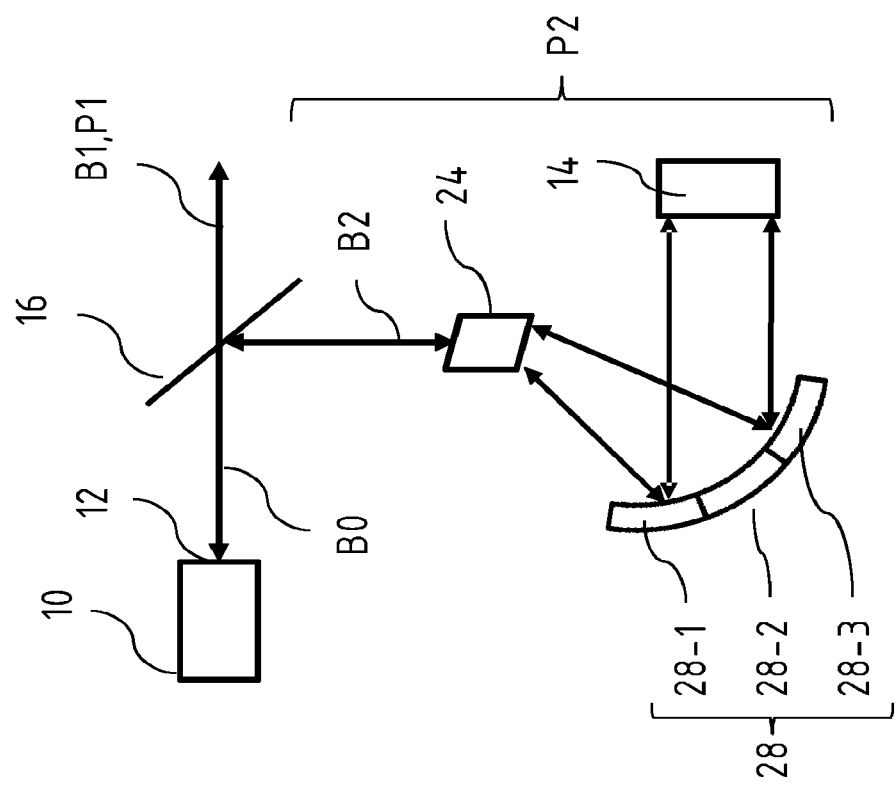
FIGS. 4a to 4d show a schematic sectional view of a laser diode arrangement according to a fourth preferred embodiment of the present invention.

As shown in the embodiment of FIG. 4a, a curved multi portion mirror 28 enables the beams which are deflected under different angles by the AOM 24 and impinging on the curved mirror 28 at different locations 28-1, 28-2 and 28-3 to be collimated and deflected onto the VBG 14. The multi portion mirror 28 may comprise different portions 28-1, 28-2 and 28-3 each having a different reflectance for the respective outcoupled laser radiation of the second beam path P2 (beam B2). The VBG 14 then reflects the beam back into the laser diode for wavelength stabilisation. The AOM 24 can be adjusted to deflect the beam B2 such that an intensity of the second beam B2 at the VBG 14 is sufficiently high for enabling stable laser operation and sufficiently low for avoiding thermal stress at the VBG 14. In order to adapt the intensity of the second beam B2 such to be independent from the intensity of outcoupled laser beam B0, the AOM 24 is preferably connected to a means for detecting the intensity of outcoupled laser beam B0.

Figure 4B:
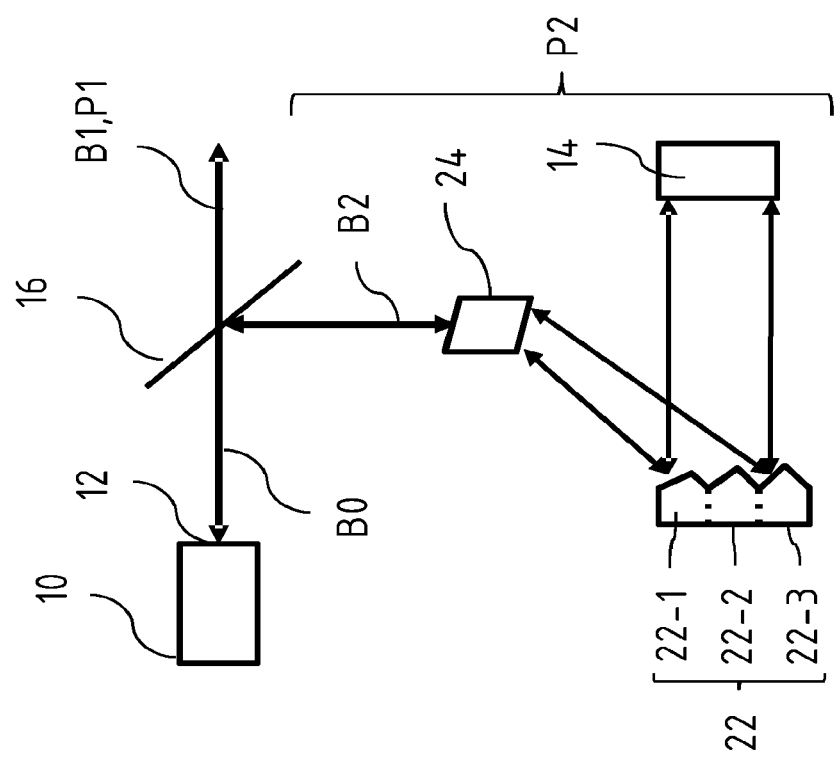

Instead of using a curved mirror 28 it may alternatively be advantageous to utilize a stepped mirror 22 having a plurality of planar portions 22-1, 22-2 and 22-3 as shown in FIG. 4b. Said planar portions 22-1, 22-2 and 22-3 have different angles with respect to the VBG 14 such to collimate the divergent radiation coming from the AOM 24 and impinging on the stepped mirror 22. The different portions 22-1, 22-2 and 22-3 may each having a different reflectance for the respective outcoupled laser radiation of the second beam path P2 (beam B2).

Figure 4C:
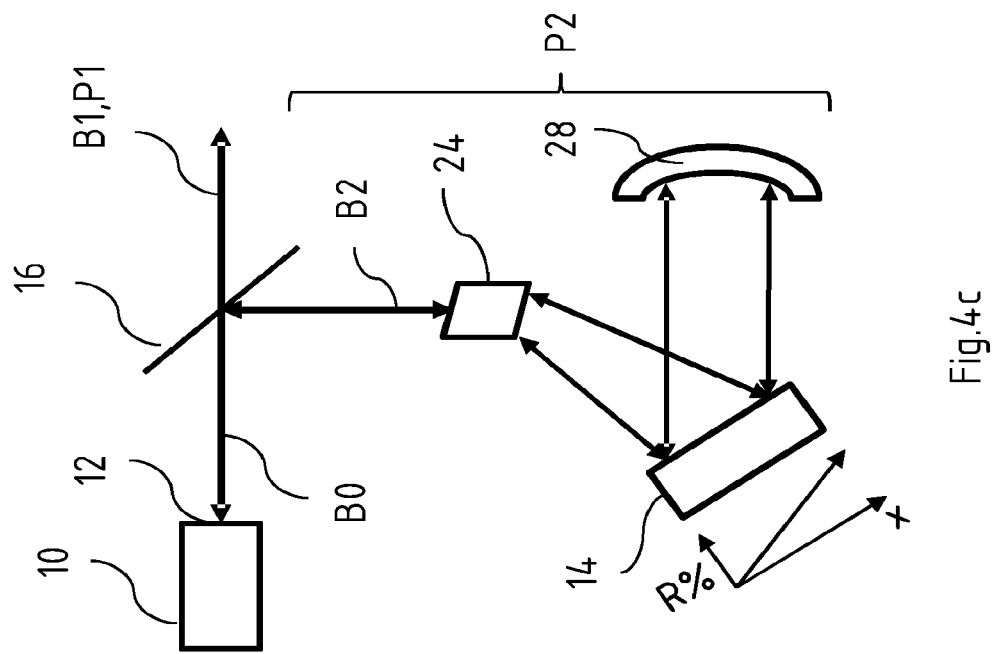

As shown in the embodiment of FIG. 4c, a VBG 14 may be utilized and positioned such that the divergent radiation coming from the AOM 24 impinges on the VBG 14. The VBG 14 is formed as a multi portion VBG that comprises a plurality of portion having a different reflectance. For example and as illustrated in FIG. 4c, the VBG 14 may have a gradually increasing reflectance along an axis x which is located in the sectional plane. In this embodiment, a curved mirror 28 is utilized which is adapted to reflect the impinging radiation back into the laser diode 10, i.e. the curved mirror 28 is formed such that all rays coming from the VBG 14 are reflected back to end in itself. In this case, the curved mirror 28 may have a uniform reflectance along its inner surface.

Figure 4D:
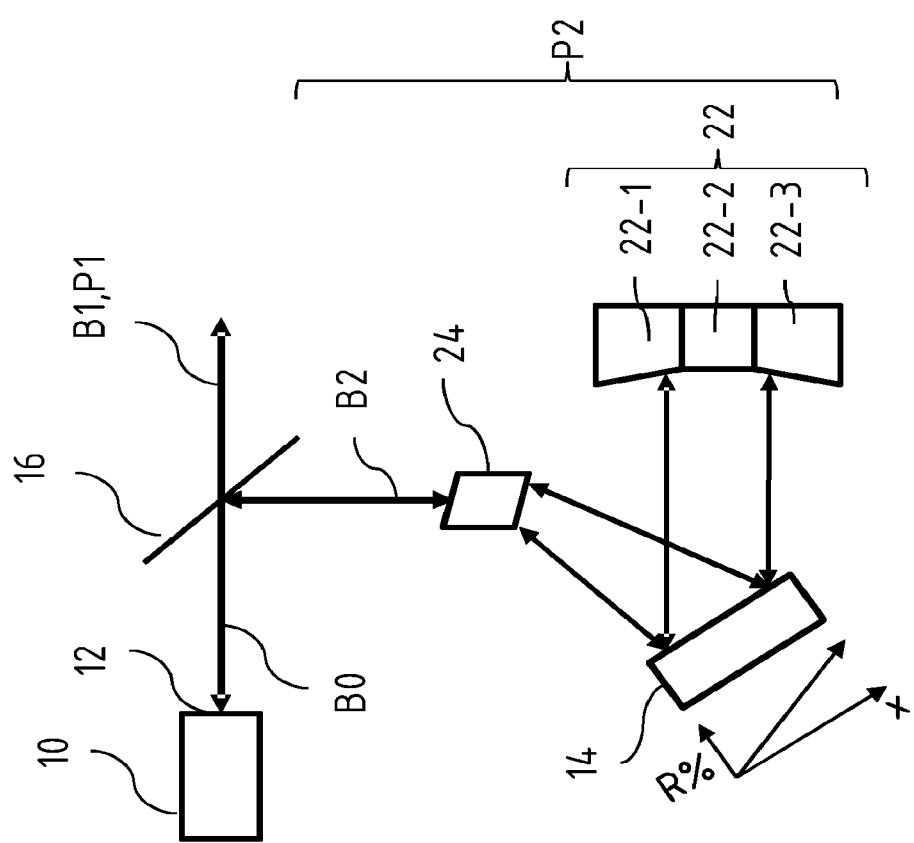

Instead of using a curved (uniformly reflecting) mirror 28 it may alternatively be advantageous to utilize a stepped mirror 22 having a plurality of planar portions 22-1, 22-2 and 22-3 as shown in FIG. 4d. Said planar portions 22-1, 22-2 and 22-3 have different angles with respect to the VBG 14 such that all rays coming from the VBG 14 are reflected back to end in itself. The different portions 22-1, 22-2 and 22-3 may have uniform reflectance for the respective outcoupled laser radiation of the second beam path P2 (beam B2). The AOM 24 can be adjusted to deflect the beam B2 such that an intensity of the second beam B2 at the VBG 14 is sufficiently high for enabling stable laser operation and sufficiently low for avoiding thermal stress at the VBG 14. In order to adapt the intensity of the second beam B2 such to be independent from the intensity of outcoupled laser beam B0, the AOM 24 is preferably connected to a means for detecting the intensity of outcoupled laser beam B0.

Figure 5:
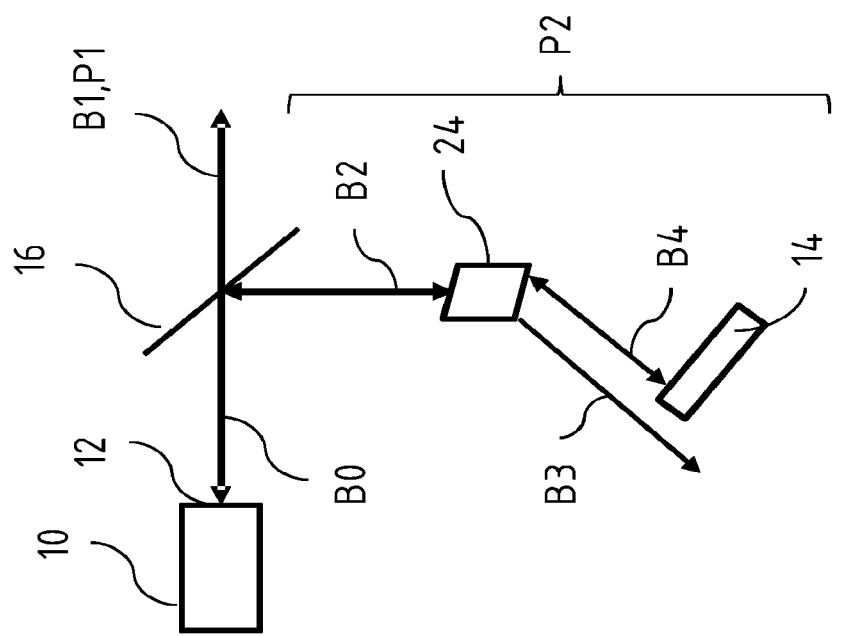
FIG. 5 shows a schematic sectional view of a laser diode arrangement according to a fifth preferred embodiment of the present invention.

FIG. 5 shows a schematic sectional view of a laser diode arrangement according to a fifth preferred embodiment of the present invention. The embodiment of FIG. 5 is similar to that of FIG. 4 but does not include a multi portion mirror 22 located between the deflection means 24 and the frequency-selective element 14. The advantage of this embodiment is that a simplified arrangement can be utilized which can control an intensity of the second beam B2 at the VBG 14 such to be sufficiently high for enabling stable laser operation and to be sufficiently low for avoiding thermal stress at the VBG 14. In detail, the AOM 24 is arranged such in relation to the position of the VBG 14 that the second beam B2 is completely directed to the VBG 14 only for relatively low intensities of the second beam B2 which are sufficiently low for avoiding thermal stress at the VBG 14. When the intensity of the outcoupled laser radiation B0 increases resulting in an increasing intensity of the second beam B2, the AOM 24 is controlled such that the beam B2 is deflected such that only a portion B4 of the second beam B2 reaches the VBG 14 while the other portion B3 of the second beam B2 passes the VBG 14 without impinging the active (reflective) area of the VBG 14. Accordingly, the intensity of the beam B4 at the VBG 14 can be controlled by the AOM 24 to be sufficiently high for enabling stable laser operation and to be sufficiently low for avoiding thermal stress at the VBG 14. In order to adapt the intensity of the second beam B4 such to be independent from the intensity of outcoupled laser beam B0, the AOM 24 is preferably connected to a means for detecting the intensity of outcoupled laser beam B0 or for detecting the intensity of the second beam B2.

FIG. 6 shows a schematic sectional view of a laser diode arrangement according to a sixth preferred embodiment of the present invention. According to this embodiment, an intensity-adaptive focussing lens 26 is arranged in the second beam path P2 which has focussing characteristics depending on the intensity of the second beam B2. That is, the lens 26 is arranged such in relation to the position of the VBG 14 that the second beam B2 is completely directed to the VBG 14 only for relatively low intensities of the second beam B2 which are sufficiently low for avoiding thermal stress at the VBG 14. When the intensity of the outcoupled laser radiation B0 increases resulting in an increasing intensity of the second beam B2, the lens 26 is controlled such that the beam B2 has a high divergence after passing through the lens 26, e.g. by adapting the focal length of the lens 26 such to be much smaller than a distance between the lens 26 and the VBG 14. In such a case only a portion of the second beam B2 reaches the VBG 14 while the another portion of the second beam B2 passes the VBG 14 without impinging the active (reflective) area of the VBG 14 due to the high divergence. Accordingly, the intensity of the beam at the VBG 14 can be controlled by the lens 26 to be sufficiently high for enabling stable laser operation and to be sufficiently low for avoiding thermal stress at the VBG 14. In order to adapt the intensity of the second beam B2 such to be independent from the intensity of outcoupled laser beam B0, the lens is preferably connected to a means for detecting the intensity of outcoupled laser beam B0 or for detecting the intensity of the second beam B2.

FIG. 7 shows a schematic sectional view of a laser diode arrangement according to a seventh preferred embodiment of the present invention. In this embodiment, optical stacking is realized by using a plurality of single emitter laser diodes stacked on top of each other such to generate parallel beams B01, B02, B03 and B04. The beam divider 16 comprises a plurality of stepped portion, each portion having a partially reflective surface which divides each of beams B01, B02, B03 and B04 into a first beam extending along the first (partial) beam path P1 and a second (partial) beam extending along the second beam path P2. The stepped portions of the beam divider 16 are formed such that an optical path from the exit facet 12 of each laser diode to the VBG 14 is the same for all beams B01, B02, B03 and B04. These beams B01, B02, B03 and B04 can advantageously use a common VBG 14 thereby reducing the overall costs of the stack laser diode arrangement.

LIST OF REFERENCE SIGNS 10 internal laser cavity
12 exit facet
14 frequency-selective element
16 beam divider
18 polarization modifying means
20 polarizer
22 multi portion mirror
24 deflection means
26 focussing lens
28 curved mirror
B0 outcoupled laser radiation
B1 first beam
B2 second beam
B3 partial beam of second beam
B4 partial beam of second beam
B01 laser beam
B02 laser beam
B03 laser beam
B04 laser beam
P1 first beam path
P2 second beam path

The invention claimed is:
1. An external cavity diode laser, comprising:
an active medium positioned inside an internal laser cavity, the internal laser cavity comprising an exit facet adapted for outcoupling laser radiation, the outcoupled laser radiation having a higher radiant intensity in a spatially stable predominant main polarization direction and a polarization component with a correspondingly lower radiant intensity in a subordinate secondary polarization direction different from the main polarization direction;
an external frequency-selective element positioned outside the internal laser cavity and adapted for wavelength stabilization of the laser radiation; and
a polarizing beam divider positioned outside the internal laser cavity behind the exit facet without a polarization rotator in between and adapted to divide the outcoupled laser radiation into a first beam extending along a first beam path and a second beam extending along a second beam path, the first beam path being different from the second beam path, and the polarizing beam divider arranged such that all of the radiant intensity of the outcoupled laser radiation from the main polarization direction is directed into the first beam extending along the first beam path;

wherein the external frequency-selective element is arranged in the second beam path, and the second beam with radiant intensity of the outcoupled laser radiation from the subordinate secondary polarization direction being reflected back into the internal laser cavity for frequency stabilization.

2. The external cavity diode laser according to claim 1, wherein the polarization component in the subordinate secondary polarization direction results from non-polarized portions of the outcoupled laser radiation.

3. The external cavity diode laser according to claim 1, wherein the degree of polarization for the main polarization in the outcoupled laser radiation is between 60% and 99%.

4. The external cavity diode laser according to claim 1, wherein the external frequency-selective element has a reflectivity of more than 90% for a wavelength band of less than 2 nm.

5. The external cavity diode laser according to claim 1, wherein a polarization modifying means is arranged in the second beam path between the beam divider and the external frequency-selective element, wherein a polarizer is located in the second beam path between the polarization modifying means and the external frequency-selective element.

6. The external cavity diode laser according to claim 1, wherein the external frequency-selective element is formed as a volume Bragg grating.

7. The external cavity diode laser according to claim 1, wherein the external frequency-selective element comprises a mirror with intensity dependent reflection coefficient.

8. The external cavity diode laser according to claim 1, further comprising a multi portion mirror comprising a plurality of portions with different reflectivity, the plurality of portions being arranged side by side to each other, the multi portion mirror being arranged in the second beam path between the beam divider and the external frequency-selective element, wherein a deflection means is arranged in the second beam path between the beam divider and the multi portion mirror, wherein the deflection means is adapted to deflect the radiation in the second beam path onto different portions of the multi portion mirror in dependence of the intensity of the outcoupled laser radiation.

9. The external cavity diode laser according to claim 1, further comprising a deflection means being arranged in the second beam path between the beam divider and the external frequency-selective element, wherein the deflection means is adapted to deflect the radiation in the second beam path such that only a portion of the radiation in the second beam path is guided onto an active area of the external frequency-selective element, the amount of the radiation portion depending of the intensity of the outcoupled laser radiation.

10. The external cavity diode laser according to claim 1, further comprising a focussing lens being arranged in the second beam path between the beam divider and the external frequency-selective element, wherein the focussing lens is adapted to focus the radiation in the second beam path onto an active area of the external frequency-selective element, the focusing power of the focussing lens depending of the intensity of the outcoupled laser radiation.

11. The external cavity diode laser according to claim 1, comprising a plurality of internal laser cavities, each internal laser cavity comprising an exit facet adapted for outcoupling laser radiation, wherein the internal laser cavities are arranged such that a plurality of stacked parallel laser beams is directed onto the beam divider, wherein the beam divider comprises a plurality of stepped portions, each of the stepped portions being adapted to divide one among the plurality of stacked parallel laser beams into a first beam extending along a first beam path and a second beam extending along a second beam path, the first beam having higher radiant intensity than the second beam and the first beam path being different from the second beam path.

* * * * *